US007511323B2

(12) United States Patent
McKee

(10) Patent No.: US 7,511,323 B2
(45) Date of Patent: Mar. 31, 2009

(54) PIXEL CELLS IN A HONEYCOMB ARRANGEMENT

(75) Inventor: Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 137 days.

(21) Appl. No.: 11/201,327

(22) Filed: Aug. 11, 2005

(65) Prior Publication Data

US 2007/0034884 A1 Feb. 15, 2007

(51) Int. Cl.
*H01L 31/062* (2006.01)

(52) U.S. Cl. .................. 257/294; 257/290; 257/291; 257/292

(58) Field of Classification Search ......... 257/290–294; 348/311–315; 438/73, 75, 78
See application file for complete search history.

(56) References Cited

U.S. PATENT DOCUMENTS

| | | | |
|---|---|---|---|
| 4,791,396 A | 12/1988 | Nishizawa et al. | |
| 5,805,217 A | 9/1998 | Lu et al. | |
| 5,955,753 A | 9/1999 | Takahashi | |
| 6,107,655 A | 8/2000 | Guidash | |
| 6,137,100 A * | 10/2000 | Fossum et al. | 250/208.1 |
| 6,141,048 A | 10/2000 | Meyers | |
| 6,160,281 A * | 12/2000 | Guidash | 257/292 |
| 6,218,656 B1 | 4/2001 | Guidash | |
| 6,326,652 B1 | 12/2001 | Rhodes | |
| 6,352,869 B1 | 3/2002 | Guidash | |
| 6,423,994 B1 | 7/2002 | Guidash | |
| 6,552,323 B2 | 4/2003 | Guidash et al. | |
| 6,657,665 B1 | 12/2003 | Guidash | |
| 6,750,912 B1 * | 6/2004 | Tennant et al. | 348/300 |
| 6,783,900 B2 | 8/2004 | Venkataraman | |
| 6,947,088 B2 | 9/2005 | Kohi | |
| 2003/0141564 A1 | 7/2003 | Kondo et al. | |
| 2004/0100570 A1 * | 5/2004 | Shizukuishi | 348/272 |
| 2004/0105021 A1 * | 6/2004 | Hu | 348/272 |
| 2005/0167574 A1 | 8/2005 | He et al. | |
| 2006/0118837 A1 * | 6/2006 | Choi | 257/292 |

FOREIGN PATENT DOCUMENTS

KR 1020040006486 1/2004

OTHER PUBLICATIONS

Takahashi et al., "A 3.9um Pixel Pitch VGA Format 10b Digital Image Sensor with 1.5 Transistor/Pixel," IEEE International Solid-State Circuit Conference, Jun. 2004, Session 6.1.*

* cited by examiner

*Primary Examiner*—Zandra Smith
*Assistant Examiner*—Paul E Patton
(74) *Attorney, Agent, or Firm*—Dickstein Shapiro LLP

(57) ABSTRACT

The present invention, in the various exemplary embodiments, provides a RGB color filter array. The red, green and blue pixel cells are arranged in a honeycomb pattern. The honeycomb layout provides the space to vary the size of pixel cells of an individual color so that, for example, the photosensor of blue pixels can be made larger than that of the red or green pixels. In another aspect of the invention, depicted in the exemplary embodiments, the honeycomb structure can also be implemented with each pixel row having a same color of pixel cells which can simplify can conversion in the readout circuits. In another aspect of the invention, the RGB honeycomb pixel array may be implemented using a shared pixel cell architecture.

39 Claims, 10 Drawing Sheets

PIXEL CELLS IN A HONEYCOMB ARRANGEMENT

FIELD OF THE INVENTION

The present invention relates generally to shared pixel cells and color filter arrays for imagers.

BACKGROUND OF THE INVENTION

Imaging devices, including charge coupled devices (CCD) and complementary metal oxide semiconductor (CMOS) imagers, are commonly used in photo-imaging applications.

A CMOS imager circuit includes a focal plane array of pixels, each of the pixels including a photosensor, for example, a photogate, photoconductor or a photodiode for accumulating photo-generated charge a portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel cell may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state; (4) transfer of charge to the storage region; (5) selection of a pixel cell for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. Nos. 6,140,630, 6,376,868, 6,310,366, 6,326,652, 6,204,524 and 6,333,205, assigned to Micron Technology, Inc., which are hereby incorporated by reference in their entirety.

With reference to FIGS. 1 and 2, which respectively illustrate top-down and cross-sectional views of a conventional CMOS pixel cell 100, when incident light 187 strikes the surface of a photodiode photosensor 120, electron/hole pairs are generated in the p-n junction of the photodiode photosensor 120 (represented at the boundary of n-type accumulation region 122 and p+type surface layer 123). The generated electrons (photo-charges) are collected in the n-type accumulation region 122 of the photosensor 120. The photo-charges move from the initial charge accumulation region 122 to a floating diffusion region 110 via a transfer transistor 106. The charge at the floating diffusion region 110 is typically converted to a pixel output voltage by a source follower transistor 108 and subsequently output on a column output line 111 via a row select transistor 109.

Conventional CMOS imager designs, such as the one shown in FIG. 1 for pixel cell 100, provide approximately a fifty percent fill factor, meaning only half of the cell 100 is dedicated to converting light to charge carriers. As shown, only a small portion of the cell 100 comprises a photosensor 120 (e.g., photodiode). The remainder of the pixel cell 100 includes isolation regions 102, shown as STI regions in a substrate 101, the floating diffusion region 110 coupled to a transfer gate 106' of the transfer transistor 106, and source/drain regions 115 for reset 107, source follower 108, and row select 109 transistors having respective gates 107', 108', and 109'. In the conventional pixel cell 100 layout, each of the reset, source follower and row select transistor gates 107', 108', 109' are aligned consecutively, sharing source/drain regions 115 and requiring significant surface area for each pixel cell 100. As scaling of pixels continues to decrease the pixel's 100 total area, it becomes increasingly important to create high sensitivity photosensors that utilize a minimum amount of surface area, or to find more efficient pixel cell layouts to minimize the area required by non-photosensitive components of the pixel cell in order to maintain relatively large areas for the photosensors.

A CMOS imager circuit is often associated with a color filter, such as a Bayer color filter for discerning varying wavelengths of light. Referring now to FIG. 3A, a color filter 30 is typically a polymer-based film sensitive to different wavelengths in the visible spectrum. Each pixel of a CMOS imager is covered with a color filter, typically a red, blue, or green filter. These color filters together comprise a color filter array ("CFA") arranged in a specific pattern. This pattern, or sequence, of filters can vary, but the "Bayer" CFA 50 pattern, has been widely adopted due to the human eye's sensitivity to green light. A typical Bayer CFA 50 pattern consists of rows of alternating red (R) and green (G) color filters and alternating blue (B) and green color filters as shown in FIG. 3A. Each color filter 30 in a Bayer CFA 50 corresponds to one pixel in an underlying CMOS imager. However, as pixel cell size decreases, the imager's sensitivity to blue light also decreases; thus, the conventional Bayer CFA 50 may not allow an underlying pixel to accurately detect blue light.

There is, therefore, a need and desire for a pixel cell with improved fill factor and a color filter array for use with the pixel cells. Additionally, there is a need and desire for a pixel cell arrangement in which the size of individual pixel cells may be customized.

BRIEF SUMMARY OF THE INVENTION

The present invention, in the various exemplary embodiments, provides a RGB color filter array. The red, green and blue pixel cells are arranged in a honeycomb pattern. The honeycomb layout provides the space to vary the size of pixel cells of an individual color so that, for example, the photosensor of blue pixels can be made larger than that of the red or green pixels.

In another aspect of the invention, depicted in the exemplary embodiments, the honeycomb structure can also be implemented with each pixel rowing having a same color of pixel cells which can simplify conversion in the readout circuits.

In another aspect of the invention, the RGB honeycomb pixel array may be implemented using a shared pixel cell architecture.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention.

The terms "wafer" and "substrate," as used herein, are to be understood as including silicon, epitaxial, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a small number of representative pixel cells are illustrated in the figures and description herein; however, typically fabrication of a large plurality of like pixel cells proceeds simultaneously. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when a portion of an object and some reference point meet to form an angle that is not 0°, 90°, or 180°, the object is considered "angled," "at an angle," or "slanted" with respect to the reference point.

Figure 1:
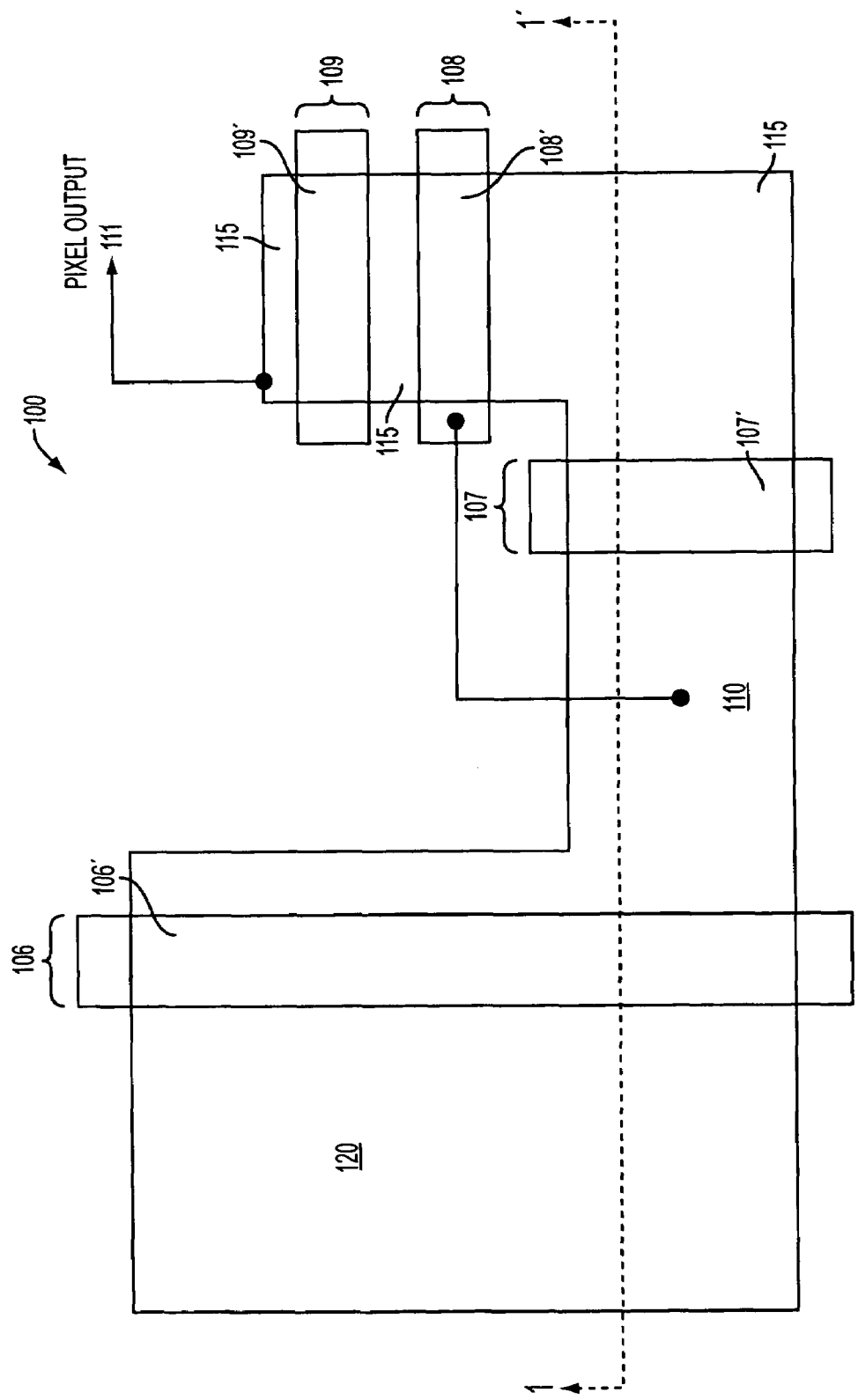
FIG. 1 illustrates a top-down view of a conventional CMOS pixel cell.
Figure 2:
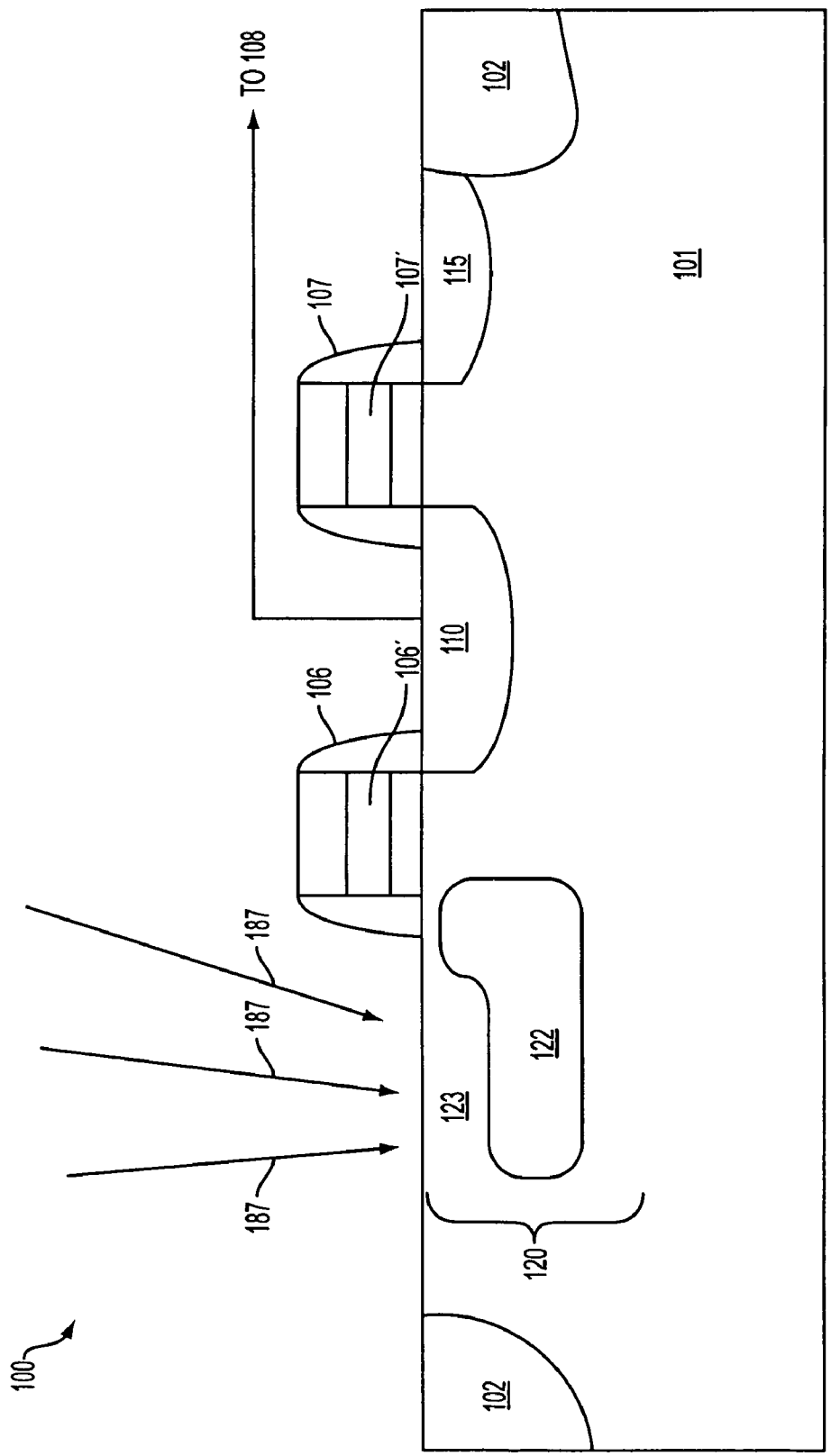
FIG. 2 illustrates a cross-sectional view of a portion of the pixel cell of FIG. 1, taken along line 1-1'.
Figure 3A:
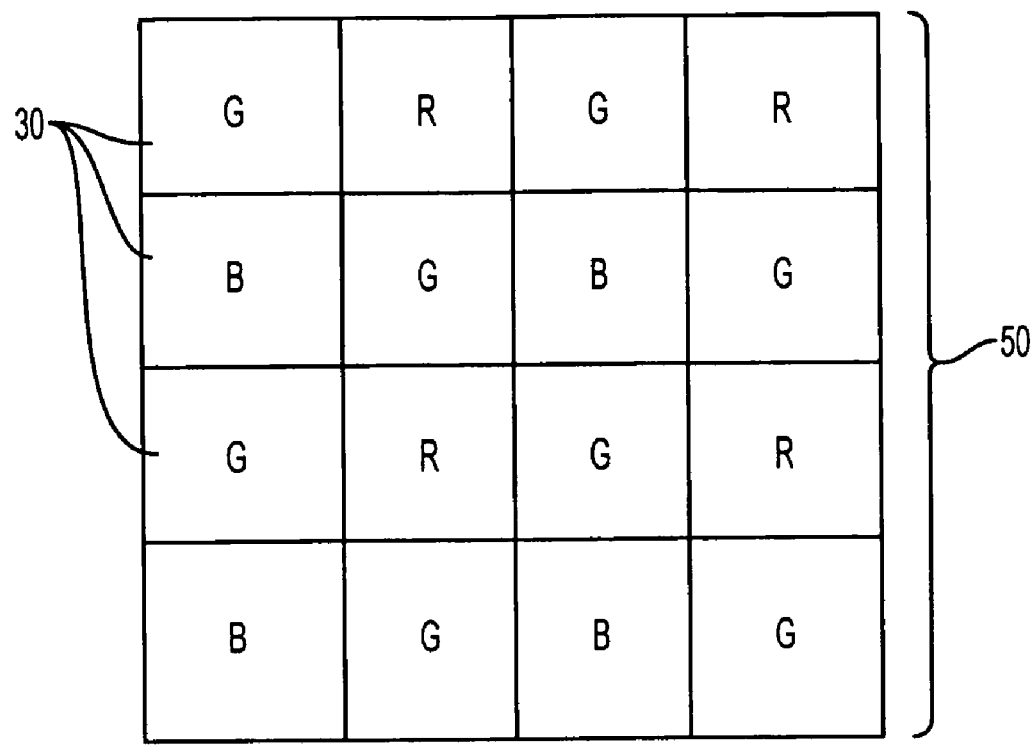
FIG. 3A illustrates a conventional Bayer color filter array.
Figure 3B:
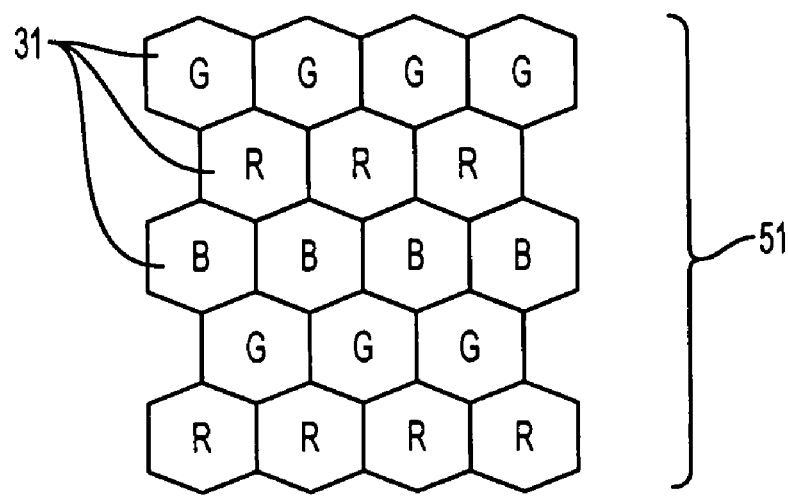
FIG. 3B illustrates a color filter array according to an exemplary embodiment of the invention.

The invention generally relates to a honeycomb layout of colored pixel cells and RGB color filter array (CFA) 51, illustrated in FIG. 3B, for use with honeycomb layout of pixel cells. Each color filter 31 in the RGB CFA 51 corresponds to one pixel in an underlying CMOS imager. Specifically, the pixel cells may provided in a honeycomb arrangement to more efficiently pack the pixel cells. To even further pack the pixel cells, a shared pixel arrangement is used (discussed below). The honeycomb arrange described herein will provide a 20 to 30 percent increase in fill factor over a conventional arrangement. In addition, the honeycomb layout of the invention provides increased scalability for the CFA 51 and microlens.

FIG. 3B illustrates a RGB CFA 51 according to an embodiment of the invention. Each color filter 31 of the RGB CFA 31 is formed over an underlying photosensor. The RGB CFA 51 is provided in a honeycomb to mimic the arrangement of the underlying photosensors. The arrangement provides that each row is made up of a single color of filters 31. The RGB CFA 51 of the invention allows for the elimination of one of the green pixels in a traditional RGBG Bayer CFA 50.

Figure 4:
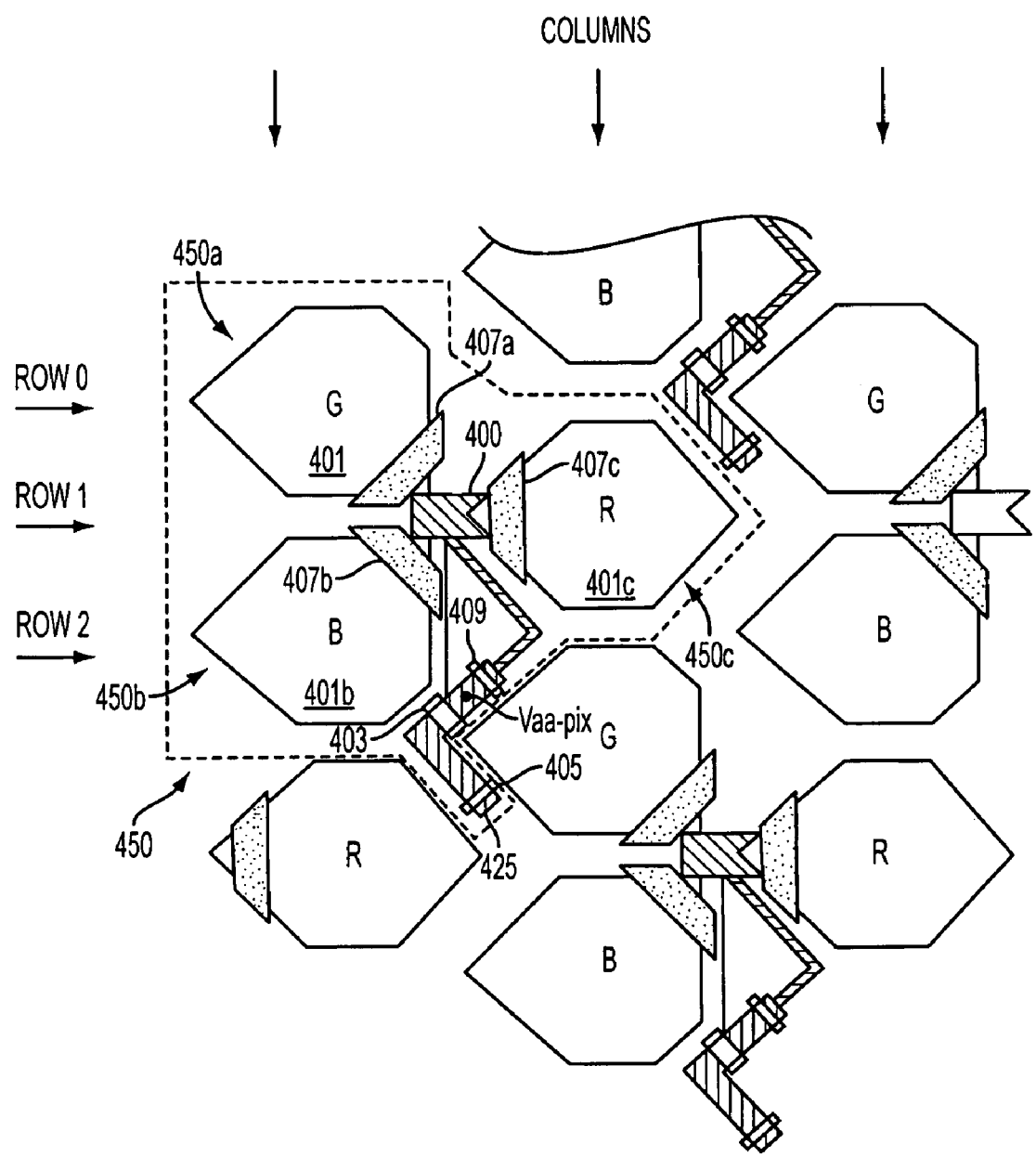
FIG. 4 illustrates a top down view of a 3-way shared pixel according to an exemplary embodiment of the invention.

FIG. 4 illustrates a 3-way shared pixel arrangement 450 in accordance with one exemplary embodiment of the invention. The 3-way shared pixels are implemented in a RGB honeycomb pattern. Each photosensor, e.g., photodiode or other photosensor, 401a, 401b, 401c has an associated transfer transistor having a respective transfer gate 407a, 407b, 407c. The transfer transistor gates 407a, 407b, 407c function independently of each other. The three photosensors 401a, 401b, 401c share a floating diffusion region 400, reset transistor having gate 409, source follower transistor having gate 403, and a row select transistor having gate 405. Optionally, the floating diffusion region 400 may be connected to a shared capacitor connected between the floating diffusion region 400 and either a voltage source or ground. The first photosensor 401a and the first transfer transistor 407a are part of the first pixel cell 450a. The second photosensor 401c and the second transfer transistor 407c are part of the second pixel cell 450c. The third photosensor 401b and the third transfer transistor 407b are part of the third pixel cell 450b.

Each row in the honeycomb arrangement 450 is made up of only a single color of pixel cells. For example, Row0 is comprised solely of green pixel cells, Row1 is comprised solely of red pixel cells and Row2 is comprised solely of blue pixel cells. Thus, as the rows are read out, all of the pixels in the row can be read out simultaneously. Readout becomes more efficient because a single gain is applied to all of the pixel signals in the row. The readout trunk for photosensors 401a, 401b, 401c is positioned in the fourth row Row3 and is shaped as a "L" for efficient use of space. Additionally, as is evident from FIG. 4, the rows do not directly line up as in a convention pixel cell arrangement, instead the row are staggered between a previous and subsequent row.

Figure 5:
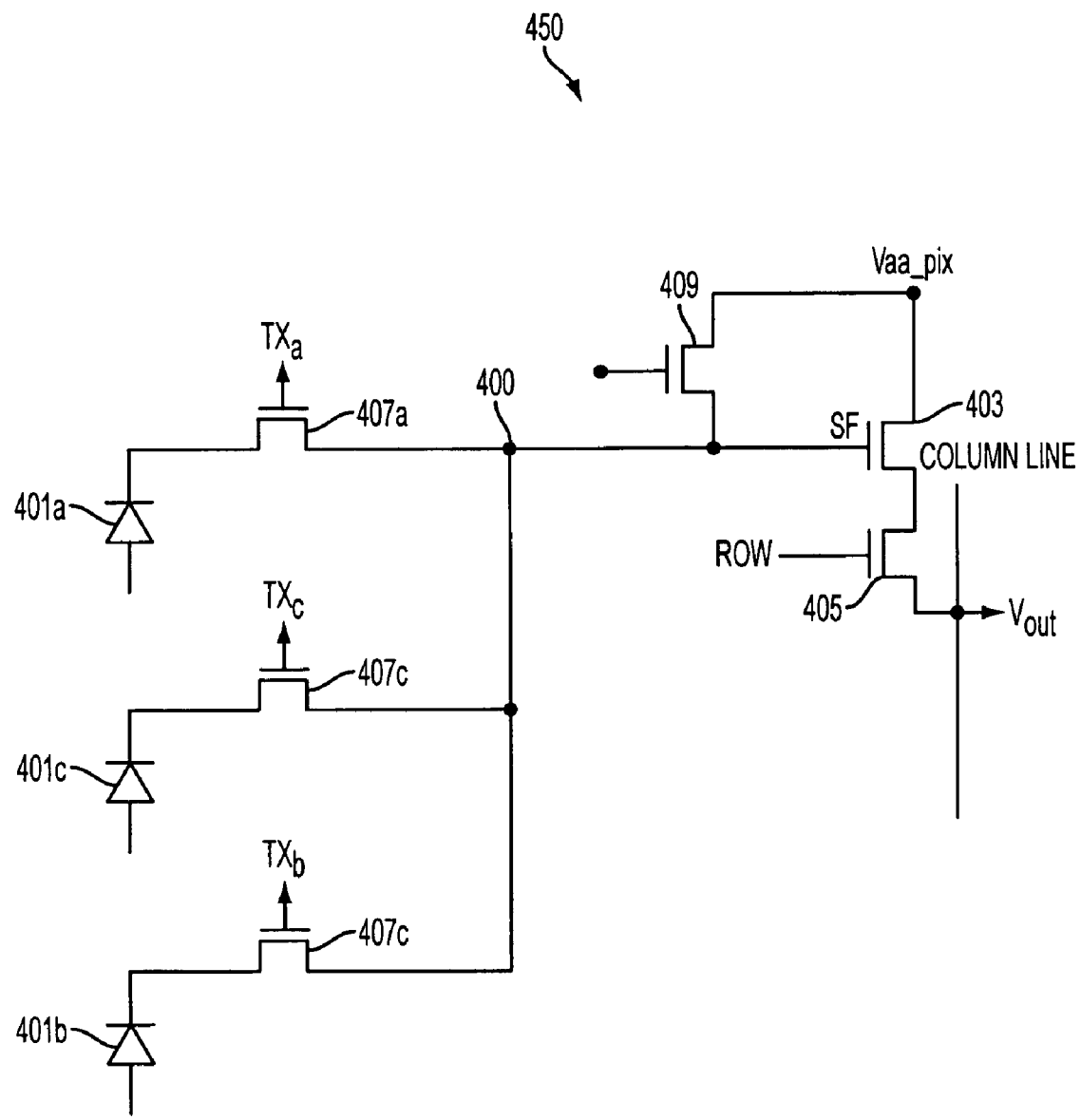
FIG. 5 illustrates an exemplary circuit diagram according to the embodiment illustrated in FIG. 4.

FIG. 5 illustrates an exemplary circuit diagram of the 3-way shared pixel cells of FIG. 4. The first photodiode 401a is connected to a first transfer transistor 407a. The first transfer transistor 407a is controllable by a first transfer gate control signal TXa. When the first TXa signal is generated, the transfer transistor 407a transfers the charge collected by the photodiode 401a to the floating diffusion region 400.

The second photodiode 401c is connected to a second transfer transistor 407c. The second transfer transistor 407c is controllable by a second transfer gate control signal TXc. When the second TXc signal is generated, the transfer transistor 407c transfers charge collected by the photodiode 401c to the floating diffusion region 400.

The third photodiode 401b is connected to a third transfer transistor 407b. The third transfer transistor 407b is controllable by a third transfer gate control signal TXb. When the third TXb signal is generated, the transfer transistor 407b transfers charge collected by the photodiode 401b to the floating diffusion region 400.

The gate of the source follower transistor 403 is electrically connected to the floating diffusion region 400. A source/drain terminal of the source follower transistor 403 is connected to the array pixel supply voltage Vaa_pix. The row select transistor 405 is connected between another source/drain region of the source follower transistor 403 and a column line 275. The reset transistor 409 is connected between the floating diffusion region 400 and the array pixel supply voltage Vaa_pix. The reset transistor 409 resets the floating diffusion region 400 before charge is transferred by the transfer transistors 407a, 407b, 407c.

Figure 6:
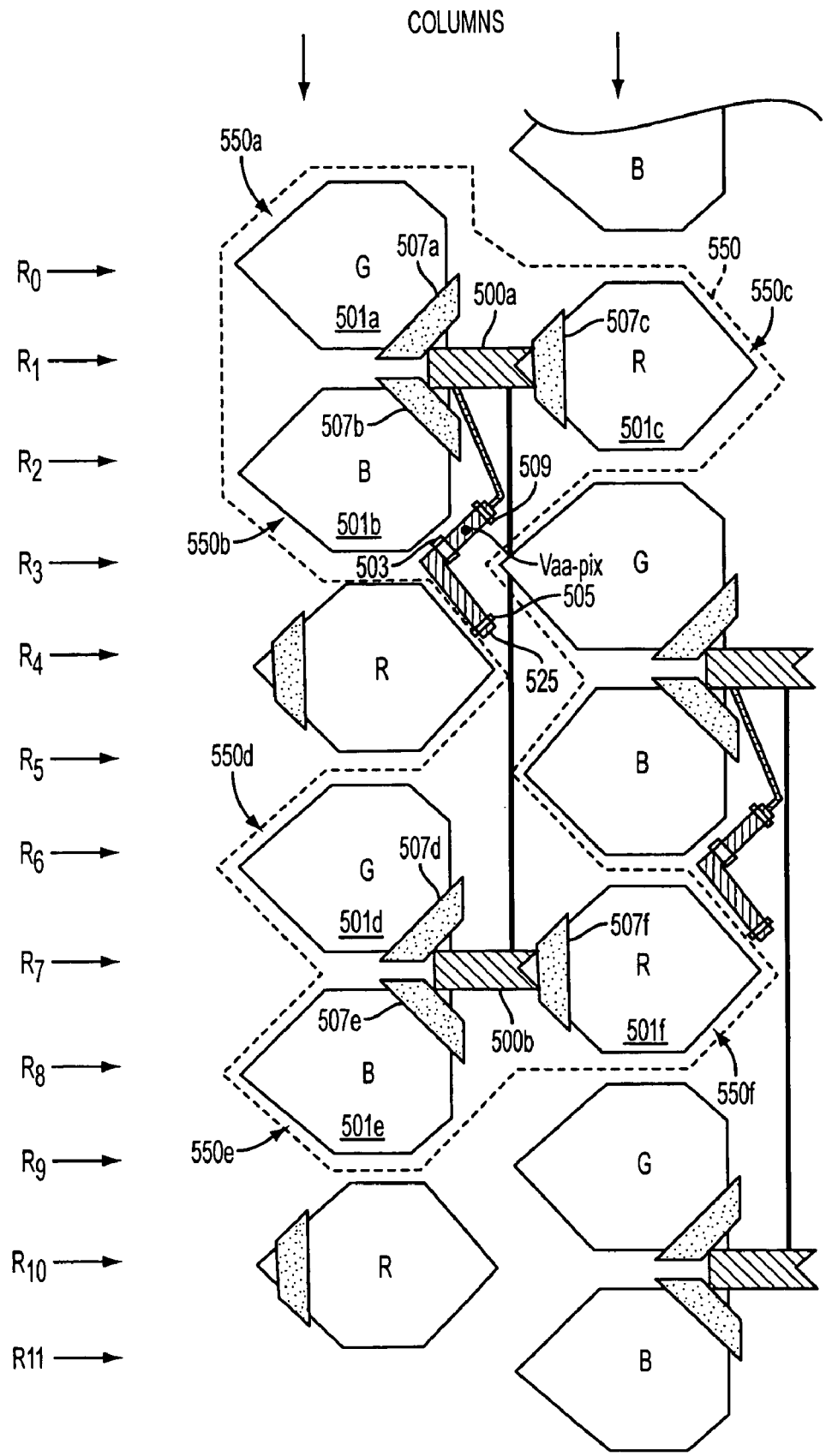
FIG. 6 illustrates a top down view of a 6-way shared pixel according to an exemplary embodiment of the invention.

In another exemplary embodiment, the honeycomb arrangement of pixels employs a 6-way shared pixel cell arrangement 550. FIG. 6 illustrates a top down view of the 6-way shared pixel cell arrangement. Each photosensor, e.g., photodiode, photogate, or other photosensor, 501a, 501b, 501c, 501d, 501e, 501f has an associated respective transfer transistor having a respective transfer gate 507a, 507b, 507c, 507d, 507e, 507f. The transfer transistor gates 507a, 507b, 507c, 507d, 507e, 507f function independently of each other. The six sensors 501a, 501b, 501c, 501d, 501e, 501f share a combined floating diffusion region 500, formed of interconnected diffusion regions 500a, 500b, reset transistor having gate 509, source follower transistor having gate 503, and a row select transistor having gate 505. Optionally, the photosensors 501a, 501b, 501c, 501d, 501e, 501f may also share a single capacitor connected between a the floating diffusion region 500 and a voltage source or ground. Each row in the honeycomb arrangement 550 is made up of only the same color pixel cells. For example, row 1 R0 is comprised solely of green pixel cells, row 2 R1 is comprised solely of red pixel cells and row 3 R2 is comprised solely of blue pixel cells. The pattern repeats for rows 4-6 R3, R4, R5. Thus, as the rows are read out, and the pixels in the row are read out simultaneously, readout becomes more efficient because a single gain is applied to all of the pixel signals in the row. The readout trunk 525 for photosensors 501a, 501b, 501c, 501d, 501e, 501f is positioned in the fourth row Row3 and is shaped as an "L" for efficient use of space. It is to be appreciated that the embodiments described herein are not limited to this layout. Additionally, as is evident from FIG. 6, the rows do not directly line up as in a convention pixel cell arrangement, instead the rows are staggered between a previous and subsequent row.

Figure 7:
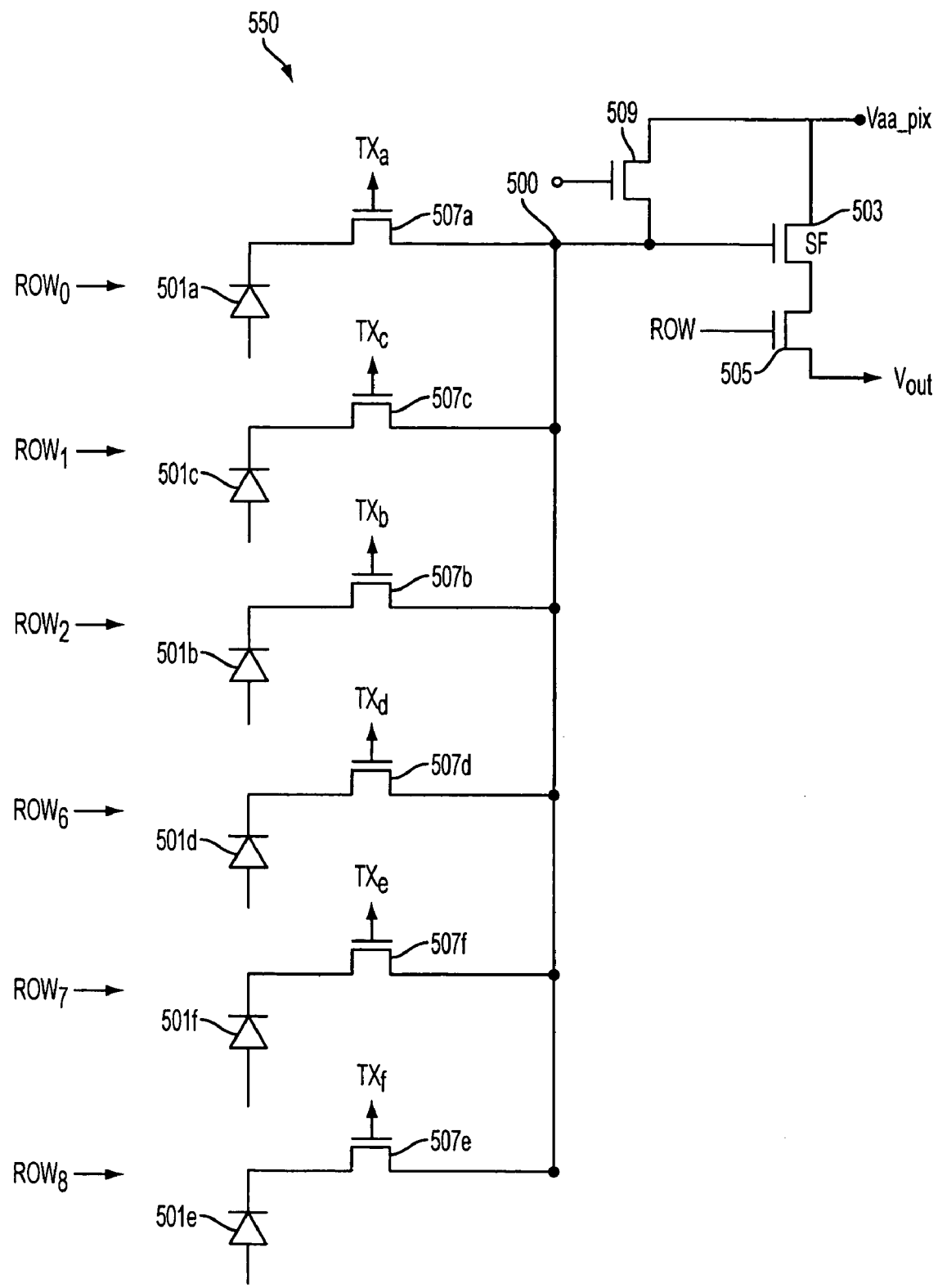
FIG. 7 illustrates an exemplary circuit diagram according to the embodiment illustrated in FIG. 6.

FIG. 7 illustrates an exemplary circuit diagram of the 6-way shared pixels of FIG. 6. In this embodiment, two 3-way shared pixels are combined by strapping together the floating diffusion regions of the shared pixels. All six pixels 550a, 550b, 550c, 550d, 550e, 550f share the reset transistor 509, source follower transistor 503 and row select transistor 505. The first photodiode 501a is connected to a first transfer transistor 507a. The first transfer transistor 507a is controllable by a first transfer gate control signal TXa. When the first transfer gate control signal TXa is generated, the transfer transistor 507a transfers the charge collected by the photodiode 501a to the floating diffusion region 500.

The second photodiode 501c is connected to a second transfer transistor 507c. The second transfer transistor 507c is controllable by a second transfer gate control signal TXc. When the second transfer gate control signal TXc is generated, the second transfer transistor 507c transfers charge collected by the photodiode 501c to the floating diffusion region 500.

The third photodiode 501b is connected to a third transfer transistor 507b. The third transfer transistor 507b is controllable by the third transfer gate control signal TXb. When the third signal TXb is generated, the transfer transistor 507b transfers charge collected by the photodiode 501b to the floating diffusion region 500.

The fourth photodiode 501d is connected to a fourth transfer transistor 507d. The fourth transfer transistor 507b is controllable by a fourth transfer gate control signal TXd. When the fourth transfer gate control signal TXd is generated, the transfer transistor 507d transfers charge collected by the photodiode 501d to the floating diffusion region 500.

The fifth photodiode 501f is connected to a fifth transfer transistor 507f. The fifth transfer transistor 507f is controllable by a fifth transfer gate control signal TXf. When the fifth transfer gate control signal TXf is generated, the transfer transistor 507f transfers charge collected by the photodiode 501f to the floating diffusion region 500.

The sixth photodiode 501e is connected to a sixth transfer transistor 507e. The sixth transfer transistor 507e is controllable by a sixth transfer gate control signal TXe. When the sixth transfer gate control signal TXe is generated, the transfer transistor 507e transfers charge collected by the photodiode 501e to the floating diffusion region 500.

The gate of the source follower transistor 503 is connected to the floating diffusion region 500. A source/drain terminal of the source follower transistor 503 is connected to the array pixel supply voltage Vaa_pix. The row select transistor 505 is connected between another source/drain terminal of the source follower transistor 503 and a column line. The reset transistor 509 is connected between the floating diffusion region 500 and array pixel supply voltage Vaa_pix. The reset transistor 509 resets the floating diffusion region 500 before charge is transferred by the transfer transistors 507a, 507b, 507c, 507d, 507e, 507f.

Figure 8:
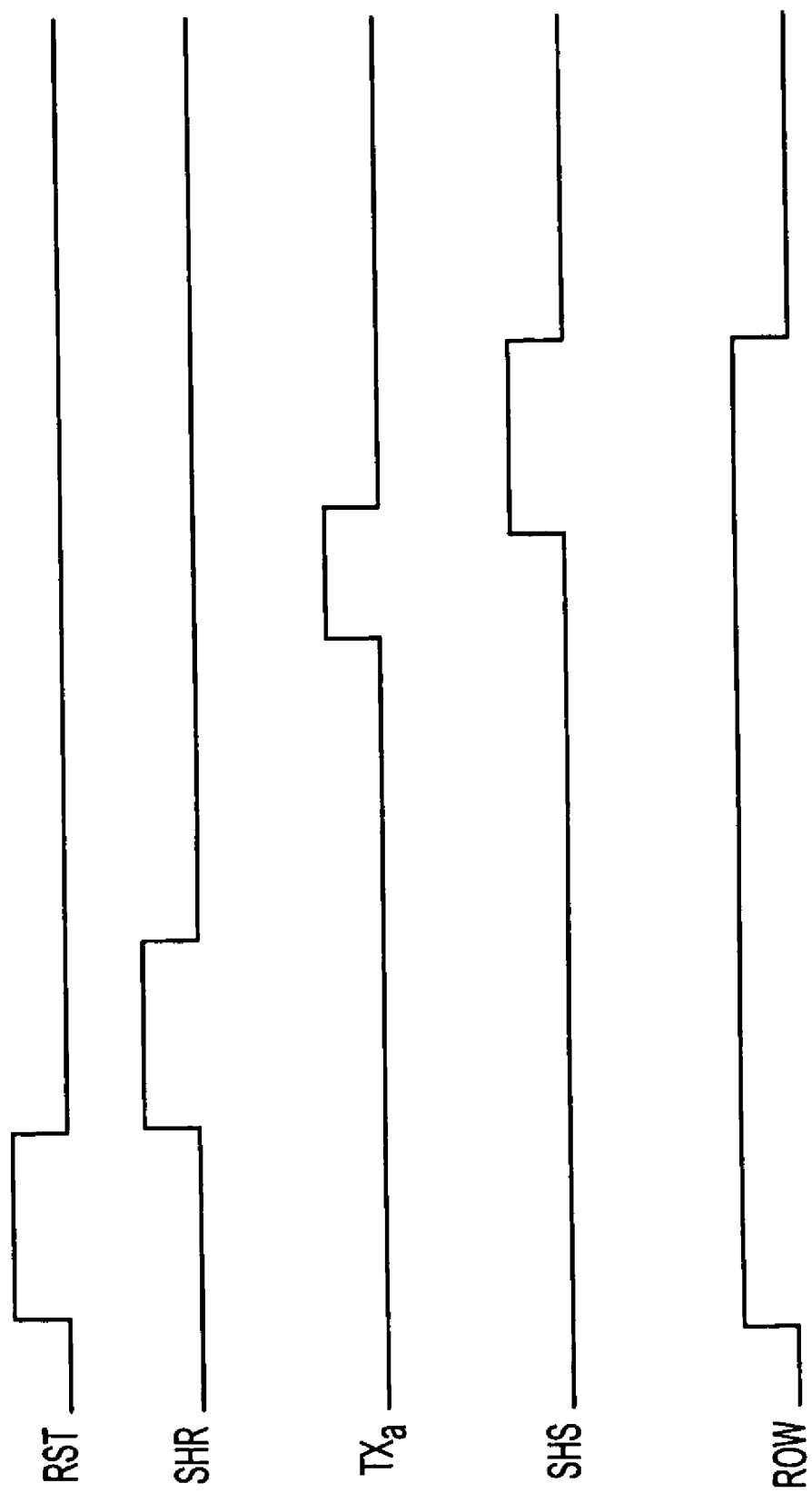
FIG. 8 illustrates an exemplary timing diagram according to the embodiments illustrated in FIGS. 4-7.

FIG. 8 is a timing diagram illustrating an exemplary operation of each of the individual pixel cells of the shared configurations illustrated in FIGS. 4-7. The timing diagram will be described with reference to pixel 450a, illustrated in FIG. 4, as an example. The row select signal ROW is applied to the gate of the row select transistor 405. The floating diffusion region 400 of the pixel circuit 450 is reset by asserting the reset control signal RST at the same time. This causes the array pixel supply voltage Vaa_pix to be applied to the floating diffusion region 400 (through the reset transistor 400). The reset signal voltage Vrst associated with the reset floating diffusion region 400, as output by the source follower transistor 403 and activated row select transistor 405, is applied to column line and is sampled and held by a sample and hold circuit 265 (FIG. 9) coupled to the column line by the pulsing of a sample and hold reset signal SHR, which activates the reset storage portion of the sample and hold circuit 265. The sample and hold circuit 265 is described in greater detail below with reference to FIG. 9.

Next, charge accumulating in the photosensor 401a, during a previously started integration period, is transferred to the floating diffusion region 400 when the transfer gate control signal TXa is asserted and activates the transfer transistor TXa of the pixel cell 450a. The pixel signal voltage Vsig associated with the pixel signal charge stored in the floating diffusion region, as output by the source follower transistor and activated row select transistor, is applied to column line and is sampled and held by a sample and hold circuit 265 (FIG. 9) coupled to the column line by the pulsing of a sample and hold pixel signal SHS, which activates the sample and hold circuit. The process described herein is repeated row-by-row for each of the pixels cells in the array.

Although the photosensor in the above described embodiments are described as photodiodes, the invention is not limited to photodiodes. For example, the 3-way and 6-way shared pixel cells described above may be implemented using photogates or photoconductors.

Another advantage of the honeycomb arrangement is realized when compensating for process misalignment. If a process misalignment occurs, the problem would only effect a single color of pixel cells. Thus, only one color of pixel cells must be compensated for.

The above described pixel cell arrangements allow for the size of individual pixel cells to be customized. For example, as pixel cells shrink, the ability to capture blue light becomes more difficult. Accordingly it may become necessary to weigh the pixel arrangement toward larger blue photosensors. The pixel cell arrangements described herein would allow for the blue photosensors, for example, to be larger than the red and green photosensors and thus accumulate more charge. Also, because the human eye is more sensitive to green light, it may be desirable to have the green photosensors larger than the photosensor for other colors. Considerable flexibility is provided by the honeycomb arrangement.

Figure 9:
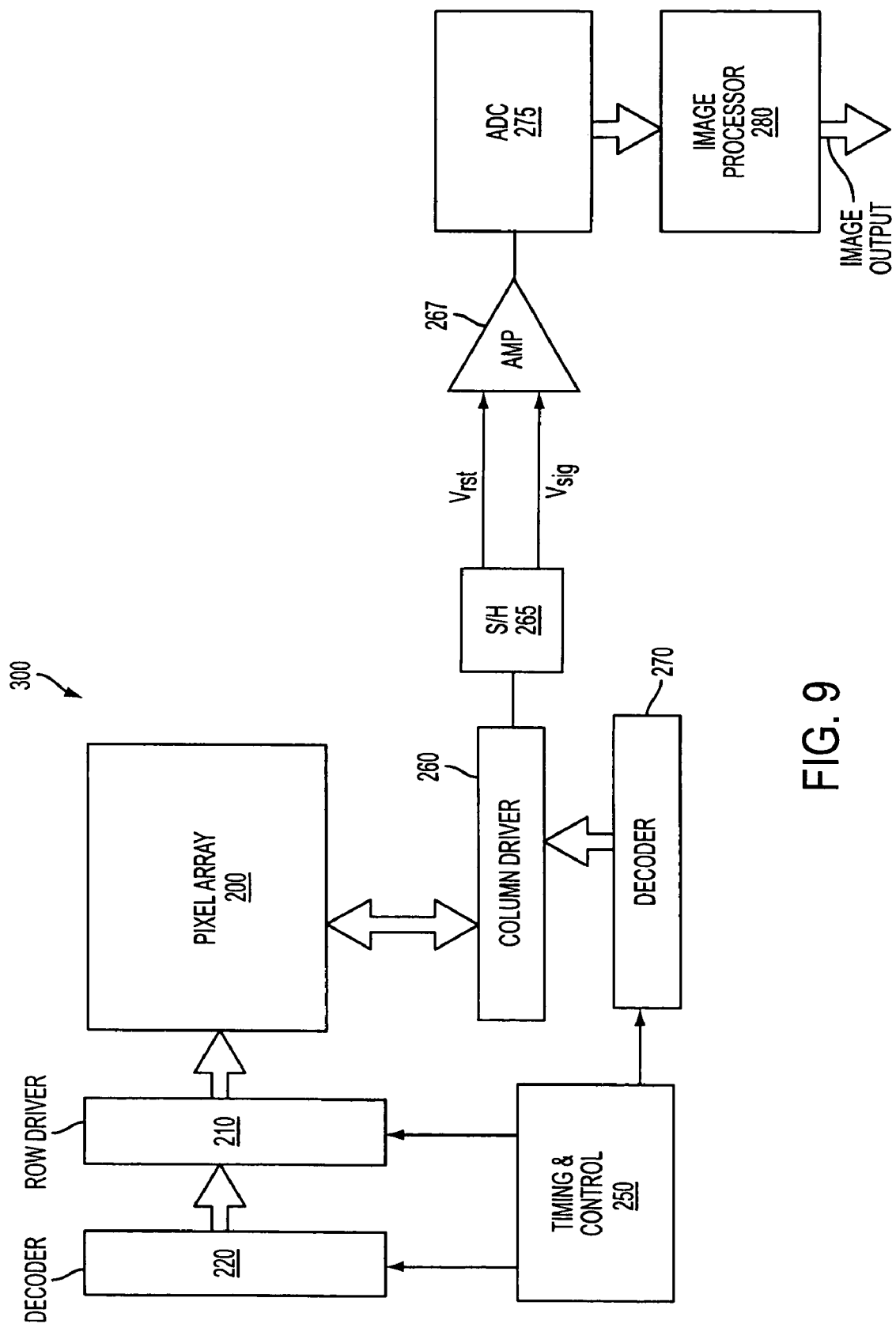
FIG. 9 illustrates a block diagram of a CMOS imager chip having an array of pixel cells constructed in accordance with the invention.

FIG. 9 illustrates a block diagram of an exemplary CMOS imager 300 having a pixel array 200 formed of pixel cells constructed in accordance with the embodiments described above. Pixel array 200 comprises a plurality of pixel cells arranged in a predetermined number of columns and rows in a honeycomb fashion as described in the exemplary embodiment above. Attached to the array 200 is signal processing circuitry, as described herein. The pixel cells of each row in array 200 can be simultaneously operated, and the pixel cells of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel cell.

The CMOS imager 300 is operated by the timing and control circuit 250, in accordance with FIG. 8, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal (Vrst), and the pixel image signals (Vsig) are read by a sample and hold circuit 265 associated with the column drive 260. A signal (Vrst-Vsig) is produced by amplifier 267 for each pixel cell. The signal is digitized by an analog-to-digital converter 275 (ADC). The analog-to-digital converter 275 supplies the digitized pixel signals to an image processor 280 which forms and outputs a digital image.

Figure 10:
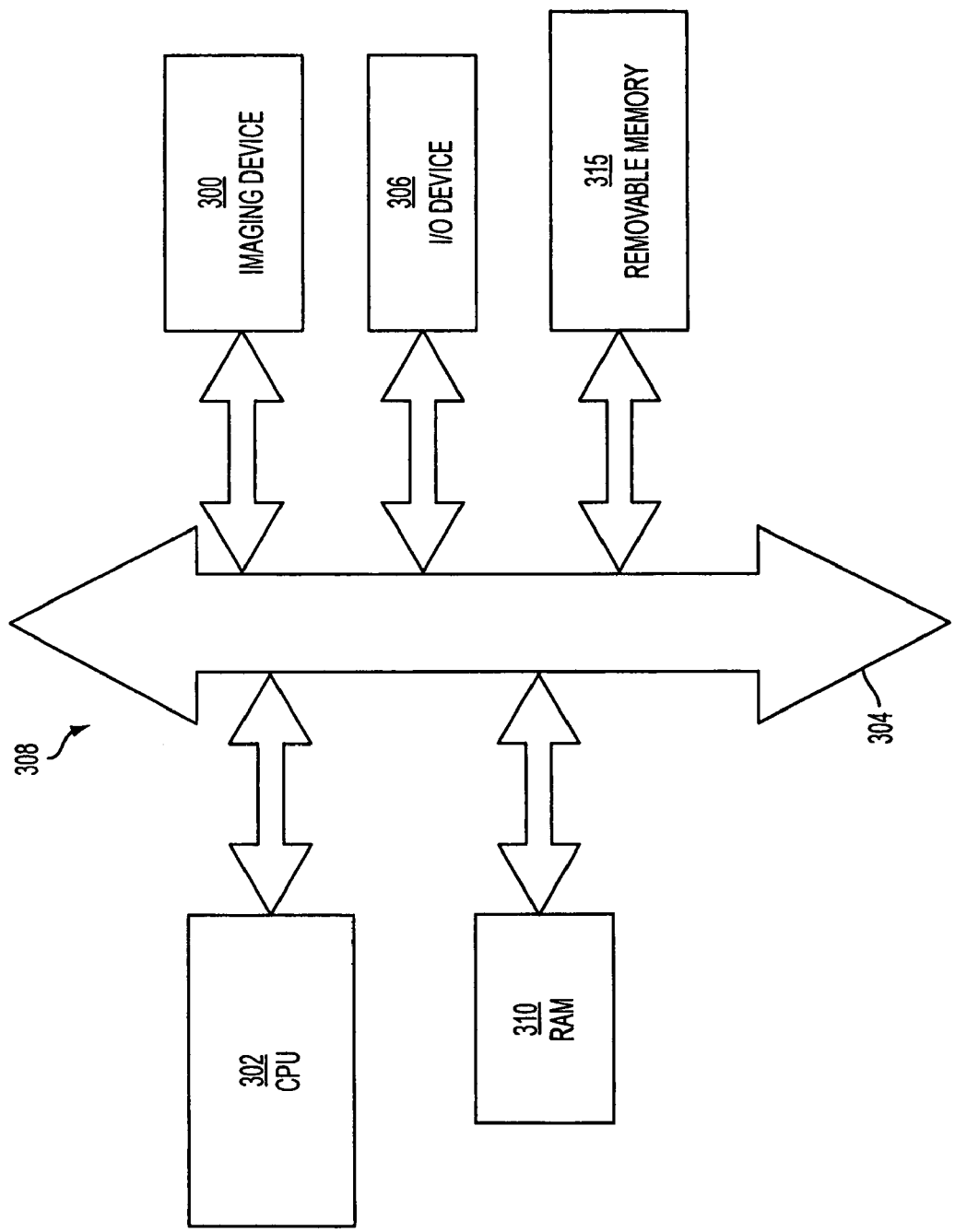
FIG. 10 illustrates a schematic diagram of a processing system employing a CMOS imager constructed in accordance with the invention.

FIG. 10 shows a processor system 308, which includes an imager 300 constructed in accordance with an embodiment of the invention. The processor system 308 may be part of a digital camera or other imaging system. The imager 300 may receive control or other data from system 308. System 308 includes a processor 302 having a central processing unit (CPU) for image processing, or other image handling operations. The processor 302 communicates with various devices over a bus 304. Some of the devices connected to the bus 304 provide communication into and out of the system 308; an input/output (I/O) device 306 and an imaging device, i.e., imager 300, are such communication devices. Other devices connected to the bus 304 provide memory, for instance, a random access memory (RAM) 310 or a removable memory 315.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is described using 3-way and 6-way shared pixels, other shared implementations may be used (e.g., 2-way or 4-way shared pixels). Any modification of the present invention that comes within the spirit and scope of the following claims should be considered part of the present invention.

What is claimed as new and desired to be protected by Letters Patent of the United States is:

1. An imager comprising:
   an array of pixel cells, said array of pixel cells being configured in a honeycomb pattern in rows and columns, and each of said pixel cells comprising a photosensor configured to collect charge; and
   a color filter formed over the photosensor,
   wherein a plurality of said pixel cells share pixel components, said shared pixel components comprise a diffusion region, a reset transistor, a row select transistor, and a source follower transistor, and each row of said pixel cells within said honeycomb pattern comprises one color of pixel cells, where said shared pixel components are shared by at least two pixel cells from a first column of said array and one pixel cell from a second column of said array.

2. The imager of claim 1, wherein a number of said plurality of the pixel cells sharing pixel components is a multiple of three.

3. The imager of claim 2, wherein the pixel cells sharing pixel have an equal proportion of blue color pixels, green color pixels and red color pixels.

4. The imager of claim 2, wherein the number of said plurality of pixel cells sharing pixel components is three pixel cells.

5. The imager of claim 2, wherein the number of said plurality of pixel cells sharing pixel components is six pixel cells, 6. The imager of claim 1, wherein each pixel cell further comprises a transfer transistor for transferring charge from the photosensor to a shared diffusion region.

7. The imager of claim 1, wherein a pixel size of a predetermined plurality of pixel cells of a first color have a photosensor of a different size then a remaining plurality of pixel color cells.

8. The imager of claim 1, wherein a pixel size of a plurality of green color pixel cells is larger than a plurality of the remaining plurality of pixel color cells.

9. The imager of claim 1, wherein a pixel size of a plurality of blue color pixel cells is larger than a plurality of the remaining plurality of pixel color cells.

10. The imager of claim 1, wherein each photosensor in a row of said array of pixels has said color filter formed of the same color.

11. An imager system, comprising:
    a processor;
    an imaging device coupled to said processor, said imaging device comprising a plurality of photosensors in rows and columns for collecting charge; and
    a color filter formed over each of said plurality of photosensors, said plurality of photosensors being formed in a honeycomb pattern,
    wherein a plurality of photosensors share pixel components, said shared pixel components comprise a reset transistor, a source follower transistor and row select transistor, and each row of said honeycomb pattern comprises color filters of the same color, where said shared pixel components share at least two pixel cells from a first column of said array and one pixel cell from a second adjacent column of said array.

12. The system according to claim 11, wherein said plurality of photosensors sharing pixel components is three pixels.

13. The system according to claim 11, wherein said plurality of photosensors sharing pixel components is six pixels.

14. The system according to claim 11, wherein said shared pixel components further comprises a diffusion region.

15. The system according to claim 11, wherein said imaging device further comprises a plurality of microlens formed over said plurality of photosensors.

16. The system according to claim 11, wherein said imaging device further comprises at least one transfer transistor for transferring charge from said photosensors to a diffusion region.

17. An imaging device comprising:
a pixel array comprising an array of rows and columns of pixels sharing at least a diffusion region, a reset transistor, a row select transistor, and a source follower transistor;
a color filter array formed over said pixels; wherein the array of pixels and the color filter array are formed over the pixel array and are formed in a honeycomb pattern having a row of said pixels corresponding to each colors,
where said shared diffusion region. reset transistor, row select transistor, and source follower transistor are shared having at least two pixel cells from a first column of said array and one pixel cell from an adjacent second column of said array.

18. The imaging device of claim 17, wherein a number of said plurality of the pixel cells sharing pixel components is a multiple of three.

19. An imager comprising:
an array of pixel cells in rows and columns, each of said pixel cells comprising a photosensor configured to collect charge, said array of pixel cells being arranged in a honeycomb pattern, and configured to share a diffusion region, a reset transistor, a row select transistor, and a source follower transistor, wherein each row of said array of pixel cells corresponds to one color,
where said shared pixel components are shared by at least two pixel cells from a first column of said array and one pixel cell from a second column of said array.

20. The imager of claim 19, wherein a number of said plurality of the pixel cells sharing pixel components is a multiple of three.

21. The imager of claim 19, wherein each pixel cell further comprises a transfer transistor for transferring charge from the photosensor to a shared diffusion region.

22. The imager of claim 19, wherein the pixel size of a predetermined plurality of pixel cells have a photosensor of a different size then the remaining plurality of pixel cells.

23. The imager of claim 19, wherein said plurality of pixel cells sharing pixel components is 3 pixel cells.

24. The imager of claim 19, wherein said plurality of pixel cells sharing pixel components is 6 pixel cells.

25. A CMOS imager comprising:
an array of pixel cells, each of said pixel cells comprising a photosensor configured to collect charge; and
a color filter array in rows and columns formed over said pixels, wherein the array of pixels and the color filter array formed over the pixel array are formed in a honeycomb pattern and wherein one color of pixel cells is larger than a remaining plurality of pixel cells, where said honeycomb patter of pixels include at least two pixel cells from a first column of said array and one pixel cell from an adjacent second column of said array.

26. The imager of claim 25, wherein a plurality of said pixel cells share pixel components.

27. The imager of claim 26, wherein said plurality of pixel cells sharing pixel components is 3 pixel cells.

28. The imager of claim 26, wherein said plurality of pixel cells sharing pixel components is 6 pixel cells.

29. The imager of claim 26, wherein said shared pixel components comprise a diffusion region, a reset transistor, a row select transistor, and a source follower transistor.

30. The imager of claim 26, wherein a number of said plurality of the pixel cells sharing pixel components is a multiple of three.

31. The imager of claim 25, wherein each pixel cell further comprises a transfer transistor for transferring charge from the photosensor to a shared diffusion region.

32. A CMOS imager comprising:
an array of pixel cells, each of said pixel cells comprising a photosensor configured to collect charge, said array of pixel cells being arranged in a honeycomb pattern, wherein one color of pixel cells is larger than a remaining plurality of pixel cells, where said honeycomb pattern of pixels includes at least two pixel cells from a first column of said array and one pixel cell from a second column of said array.

33. The imager of claim 32, wherein a plurality of said pixel cells share pixel components.

34. The imager of claim 33, wherein said plurality of pixel cells sharing pixel components is 3 pixel cells.

35. The imager of claim 33, wherein said plurality of pixel cells sharing pixel components is 6 pixel cells.

36. The imager of claim 33, wherein said shared pixel components comprise a diffusion region, a reset transistor, a row select transistor, and a source follower transistor.

37. The imager of claim 33, wherein a number of said plurality of the pixel cells sharing pixel components is a multiple of three.

38. The imager of claim 32, wherein each pixel cell further comprises a transfer transistor for transferring charge from the photosensor to a shared diffusion region.

39. A CMOS imager comprising:
n array of pixel cells, each of said pixel cells comprising a photosensor configured to collect charge, said array of pixel cells in rows and columns being arranged in a honeycomb pattern; and
shared readout circuitry formed arranged between pixel cells in said honeycomb pattern where said shared readout circuitry are shared having at least two pixel cells from a first column of said array and one pixel cell from an adjacent second column of said array.

* * * * *